(12) United States Patent
Yin et al.

(10) Patent No.: US 10,877,084 B2
(45) Date of Patent: Dec. 29, 2020

(54) NONLINEAR MODEL TRANSFORMATION SOLVING AND OPTIMIZATION METHOD FOR PARTIAL DISCHARGE POSITIONING BASED ON MULTI-ULTRASONIC SENSOR

(71) Applicant: WUHAN UNIVERSITY, Hubei (CN)

(72) Inventors: Baiqiang Yin, Hubei (CN); Yigang He, Hubei (CN); Hui Zhang, Hubei (CN); Bing Li, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 31 days.

(21) Appl. No.: 16/108,104

(22) Filed: Aug. 22, 2018

(65) Prior Publication Data
US 2019/0302169 A1    Oct. 3, 2019

(30) Foreign Application Priority Data

Mar. 30, 2018 (CN) .......................... 2018 1 0297996

(51) Int. Cl.
*G01R 31/12* (2020.01)

(52) U.S. Cl.
CPC .................. *G01R 31/1209* (2013.01)

(58) Field of Classification Search
CPC ............ G01R 31/2894; G01R 31/2853; G11C 29/022; G11C 29/816
USPC .................................. 324/71.11, 73.1, 76.11
See application file for complete search history.

(56) References Cited

U.S. PATENT DOCUMENTS

| 4,072,200 A * | 2/1978 | Morris ....................... E21B 7/04 |
| | | 175/45 |
| 4,933,640 A * | 6/1990 | Kuckes ............. E21B 47/02216 |
| | | 166/66.5 |
| 2002/0062992 A1* | 5/2002 | Fredericks .............. E21B 47/00 |
| | | 175/40 |
| 2015/0120218 A1* | 4/2015 | Garnacho Vecino ........................ |
| | | G01R 31/1263 |
| | | 702/58 |

(Continued)

*Primary Examiner* — Giovanni Astacio-Oquendo
(74) *Attorney, Agent, or Firm* — JCIPRNET

(57) ABSTRACT

A nonlinear model transformation solving and optimization method for partial discharge positioning based on multi-ultrasonic sensor includes the following steps: (1) constructing a spatial rectangular coordinate system in a transformer, and setting a position of each ultrasonic sensor; (2) constructing a positioning model on the basis of an arrival time positioning method to obtain a nonlinear positioning equation set for solving a position of a PD source; (3) eliminating second-order terms in the nonlinear positioning equation set to transform the nonlinear positioning equation set into a linear equation set; (4) obtaining multiple sample initial values of a coordinate of the PD source; (5) screening the multiple sample initial values; (6) performing clustering processing on the multiple effective sample initial values by adopting an improved K-means algorithm; and (7) selecting a class with most cluster elements, and calculating a mean of the elements of the class to finally determine an optimal coordinate of the PD source. According to the present invention, the present problems of selection difficulty, iteration non-convergence, long operation time, sensitivity to an arrival time error and the like of an iteration algorithm adopted when a nonlinear model is solved are effectively solved.

10 Claims, 4 Drawing Sheets

(56) References Cited

U.S. PATENT DOCUMENTS

2015/0185270 A1* 7/2015 Xie .................. G01R 31/62
            702/58
2016/0187428 A1* 6/2016 Basu ................ G01R 31/367
            702/63

* cited by examiner

NONLINEAR MODEL TRANSFORMATION SOLVING AND OPTIMIZATION METHOD FOR PARTIAL DISCHARGE POSITIONING BASED ON MULTI-ULTRASONIC SENSOR

CROSS-REFERENCE TO RELATED APPLICATION

This application claims the priority benefit of China application serial no. 201810297996.5, filed on Mar. 30, 2018. The entirety of the above-mentioned patent application is hereby incorporated by reference herein and made a part of this specification.

BACKGROUND OF THE INVENTION

1. Field of the Invention

The present invention belongs to the technical field of high voltages, and relates to a nonlinear model transformation solving and optimization method for partial discharge (PD) positioning based on multi-ultrasonic sensor.

2. Description of Related Art

Most of failures of a power grid are caused by electrical insulation defects. Partial discharge (PD) is a discharge phenomenon triggered by an electrical insulation defect. PD positioning detection is important means for evaluating an insulation state of equipment, and determining an accurate position of a PD source may reflect an insulation condition of the equipment and construct a maintenance strategy more accurately, thereby prolonging the service life of the equipment and improving operating reliability. PD positioning detection may usually be implemented by methods such as an electrical method, ultrahigh-frequency electromagnetic waves and ultrasonic waves. The electrical method determines an electrical position where PD occurs but not a spatial position and thus is rarely used in practice. A propagation speed of an electromagnetic wave is extremely high and slightly lower than a light speed in vacuum, and it is very hard to obtain a direct wave and accurately measure a time delay. An ultrasonic wave is high in anti-electromagnetic interference capability and the sound speed is relatively slow, a requirement on accuracy of arrival time is not very high, and an ultrasonic sensor is low in cost and easy to use for online monitoring. At present, an ultrasonic wave-based PD positioning method is to construct a positioning model on the basis of an arrival time positioning method to obtain a nonlinear positioning equation set for solving a position of a PD source. Difficulty in solving of the nonlinear equation set is related to selection of an iteration algorithm, a square root operation in a solving process may lead to solution non-uniqueness and long operation time, and the non-convergence iteration may make the equation set unsolvable. During practical monitoring, measurement of arrival time of an ultrasonic signal at a sensor is influenced by various interference factors, which may make it impossible to accurately acquire the arrival time of the ultrasonic signal at the sensor and further bring influence to positioning accuracy.

SUMMARY OF THE INVENTION

For the shortcoming existing in an existing PD ultrasonic positioning method, the present invention provides a nonlinear model transformation solving and optimization method for partial discharge positioning based on multi-ultrasonic sensor to meet a requirement on higher positioning accuracy. The method is high in universality, short in operation time and free of non-convergence during iteration, dependence of solving of an equation set on selection of an iteration algorithm is avoided, and the problem of a relatively poor positioning result caused by an arrival time error is effectively solved.

In order to solve the technical problem, the technical solution adopted by the present invention is implemented as follows.

A nonlinear model transformation solving and optimization method for partial discharge positioning based on multi-ultrasonic sensor includes the following steps:

(1) constructing a spatial rectangular coordinate system in a transformer, and setting a position of each ultrasonic sensor;

(2) constructing a positioning model on the basis of an arrival time positioning method to obtain a nonlinear positioning equation set for solving a position of a PD source;

(3) eliminating second-order terms in the nonlinear positioning equation set to transform the nonlinear positioning equation set into a linear equation set;

(4) acquiring arrival time of an ultrasonic wave from the PD source at each ultrasonic sensor, and substituting the arrival time of the ultrasonic wave from the PD source at each ultrasonic sensor and a coordinate of each sensor into the linear equation set for solving and obtaining multiple sample initial values of a coordinate of the PD source;

(5) screening the multiple sample initial values to remove unreasonable data and obtain effective multiple sample initial values;

(6) performing clustering processing on the effective multiple sample initial values by adopting an improved K-means algorithm; and (7) selecting a class with most cluster elements, and calculating a mean of the elements of the class to finally determine an optimal coordinate of the PD source.

According to the aforementioned solution, in Step (1), construction of the spatial rectangular coordinate system refers to taking a vertex of the bottom of the transformer as an origin of the spatial rectangular coordinate system and taking three edges connected with the vertex as an x-axis, a y-axis and a z-axis of the spatial rectangular coordinate system; and setting of the position of each ultrasonic sensor refers to placing multiple ultrasonic sensors in the transformer under the constructed spatial rectangular coordinate system, wherein one of the ultrasonic sensor is positioned at the origin and the rest of the ultrasonic sensors are not on the same plane.

According to the aforementioned solution, in Step (2), the arrival time positioning method refers to constructing the nonlinear positioning equation set for solving the position of the PD source through information of signal receiving time of the multiple sensors; and an expression of the nonlinear positioning equation set is:

$$\begin{cases} (x-0)^2 + (y-0)^2 + (z-0)^2 = v^2(t_0-t)^2 \\ (x-x_1)^2 + (y-y_1)^2 + (z-z_1)^2 = v^2(t_1-t)^2 \\ (x-x_2)^2 + (y-y_2)^2 + (z-z_2)^2 = v^2(t_2-t)^2 \\ (x-x_3)^2 + (y-y_3)^2 + (z-z_3)^2 = v^2(t_3-t)^2 \\ \quad\vdots \\ (x-x_{n-1})^2 + (y-y_{n-1})^2 + (z-z_{n-1})^2 = v^2(t_{n-1}-t)^2 \end{cases},$$

where n is the number of the ultrasonic sensors, the position ($x_0$, $y_0$, $z_0$) of the reference sensor is at the origin, namely, $x_0=y_0=z_0=0$, $x_i$ (i=1, 2, . . . , n−1) is an x-axis coordinate of each of the other n−1 ultrasonic sensors, $y_i$ (i=1, 2, . . . , n−1) is a y-axis coordinate of each of the other n−1 ultrasonic sensors, $z_i$ (i=1, 2, . . . , n−1) is a z-axis coordinate of each of the other n−1 ultrasonic sensors, t is occurrence time of PD, $t_i$ (i=1, 2, . . . , n−1) is the arrival time of the ultrasonic wave from the PD source at each ultrasonic sensor, and v is an equivalent wave velocity of the ultrasonic wave.

According to the aforementioned solution, in Step (3), elimination of the second-order tell is refers to expanding each equation in the nonlinear positioning equation set for difference calculation to obtain a linear equation set AX=B, where $$A = \begin{bmatrix} 2x_1 & 2y_1 & 2z_1 & t_1^2 - t_0^2 & 2(t_0 - t_1) \\ 2x_2 & 2y_2 & 2z_2 & t_2^2 - t_0^2 & 2(t_0 - t_2) \\ 2x_3 & 2y_3 & 2z_3 & t_3^2 - t_0^2 & 2(t_0 - t_3) \\ \vdots & \vdots & \vdots & \vdots & \vdots \\ 2x_{n-1} & 2y_{n-1} & 2z_{n-1} & t_{n-1}^2 - t_0^2 & 2(t_0 - t_{n-1}) \end{bmatrix},$$

$$X = \begin{bmatrix} x \\ y \\ z \\ G \\ H \end{bmatrix}, B = \begin{bmatrix} K_1 \\ K_2 \\ K_3 \\ \vdots \\ K_{n-1} \end{bmatrix},$$

where $G=v^2$, $H=v^2 t$ and $K_i = x_i^2 + y_i^2 + z_i^2$ (i=1, 2, . . . , n−1).

According to the aforementioned solution, in Step (4), the multiple sample initial values refer to that more than 6 ultrasonic sensors are used for PD positioning, and coordinates and arrival time $t_i$ corresponding to each of the 6 ultrasonic sensors are substituted into the linear equation set to obtain a sample initial value of the coordinate of the PD source, thus to obtain the multiple sample initial values of the coordinate of the PD source.

According to the aforementioned solution, in Step (5), the unreasonable data refers to part of equivalent wave velocities of the ultrasonic wave calculated when the linear equation set is solved in Step (3) are imaginary numbers or obviously higher than or lower than a numerical value of a normal wave velocity.

According to the aforementioned solution, in Step (6), the improved K-means algorithm specifically includes the following steps:

1) calculating an evaluation index Q of each sample point in N sample points according to the following formula:

$$Q = \omega_i \cdot \|P_i - \bar{P}\|,$$

where $P_i$ is the ith sample point, $\bar{P}$ is a mean of the sample points, $\|\bullet\|$ represents a Euclidean distance, $\omega_i$ is a weight of the ith sample point, $\omega_i$ is all 1 herein, i=1, 2, . . . , N, N is the total number of the sample points.

The evaluation index Q is positively correlated with the Euclidean distance of the mean of the sample points; sequencing Q values of the sample points from low to high, equally dividing samples into k classes, k=N/3~N/2, and selecting a central sample of each class as an initial cluster center point of the class;

2) if a distance between two initial cluster center points is smaller than a predetermined threshold value θ, wherein θ<5 cm, one cluster center point is removed to update a cluster number recorded as k*;

3) calculating Euclidean distances between each sample point $P_i$ and all cluster centers, and if the following formula is met, dividing the sample point $P_i$, into a class $C_l$:

$$\|P_i - c_l\| < \|P_i - c_m\| \quad (20),$$

where l=1, 2, . . . , k; m=1, 2, . . . k; i=1, 2, . . . N, l≠m, $c_l$ is the cluster center of the class $C_l$, and $c_m$ is the cluster center of a class $C_m$;

4) recalculating new cluster centers according to a new cluster relationship (performing loop iteration in such a manner until a convergence condition is met); and 5) ending if the improved K-means algorithm meets a convergence condition, otherwise returning to Step 2) for next iterative calculation, wherein the convergence condition is as follows:

① changes in distances between the cluster center points in two iterations are smaller than a threshold value ε, wherein ε<0.0001, and ② E is kept unchanged in the following formula:

$$E = \sum_{i=1}^{k} \sum_{P_j \in C_i} \|P_j - c_i\|^2,$$

where E is a sum of square errors of all objects in the sample points, $P_j$ is a sample point of a class $C_i$, $c_i$ is the cluster center of the class $C_i$, and $\|\bullet\|^2$ represents for a square Euclidean distance.

According to the aforementioned solution, for preventing an endless loop caused by the fact that the ending condition in Step 5) is not met, a fixed maximum iteration number is given during execution of the algorithm, and when an iteration number reaches the maximum iteration number, clustering is ended.

According to the aforementioned solution, in Step (7), calculation of the mean refers to, after clustering processing in Step (6), selecting all the initial values in the class with most cluster elements, and calculating means of the x-axis coordinates, y-axis coordinates and z-axis coordinates of all the initial values respectively to obtain a final coordinate of the PD source.

Compared with the prior art, the present invention has the following beneficial effects: nonlinear model transformation solving and optimization method for partial discharge positioning based on multi-ultrasonic sensor are adopted, the method is high in universality, short in operation time and free of iteration non-convergence, dependence of solving of an equation set on selection of an iteration algorithm is avoided, and the problem of a relatively poor positioning result caused by an arrival time error is effectively solved.

DESCRIPTION OF THE EMBODIMENTS

The present invention will be further described below in combination with the accompanying drawings and embodiments.

Figure 1:
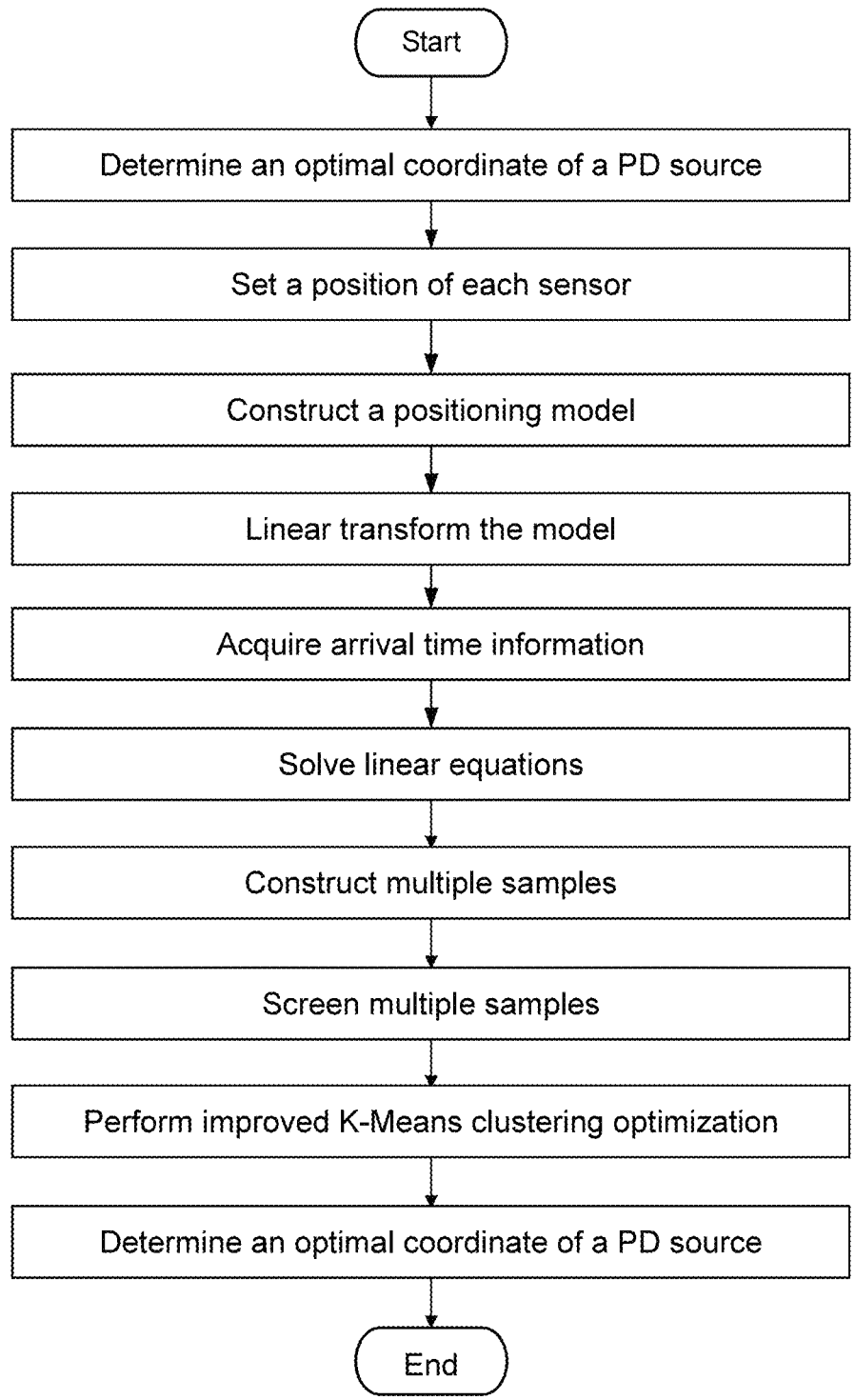
FIG. 1 is a flowchart of a nonlinear model transformation solving and optimization method for partial discharge positioning based on multi-ultrasonic sensor according to the present invention.

Referring to FIG. 1, a nonlinear model transformation solving and optimization method for partial discharge positioning based on multi-ultrasonic sensor of the present invention includes the following steps:

(1) A spatial rectangular coordinate system is constructed in a transformer, wherein a vertex at the bottom of the transformer is taken as an origin of the spatial rectangular coordinate system, and three edges connected with the vertex are taken as an x-axis, a y-axis and a z-axis of the spatial rectangular coordinate system. A position of each ultrasonic sensor is set. For example, when there are 6 ultrasonic sensors, the 6 ultrasonic sensors are placed in the transformer, and in the 6 ultrasonic sensors, a position of a reference sensor is at the origin, and positions of the other 5 ultrasonic sensors are on the same plane.

(2) A positioning model is constructed on the basis of an arrival time positioning method to obtain a nonlinear positioning equation set for solving a position of a PD source. In order to determine the position of the PD source in a three-dimensional space, at least 4 or more sensors are required to simultaneously detect a signal of the PD source. If an ultrasonic wave is propagated from the PD source to the surrounding at an equivalent wave velocity, arrival time of an ultrasonic wave signal at each sensor is measured to construct a hyperboloid equation set corresponding to the time, and an intersection is a coordinate of the PD source. Let the coordinate of the PD source be P(x, y, z), a coordinate of each sensor be $S(x_i, y_i, z_i)$ (i=1, 2, ..., n−1), the coordinate of a reference sensor be S(0, 0, 0), occurrence time of PD be t, arrival time of the ultrasonic wave from the PD source at each ultrasonic sensor be $t_i$ and v be the equivalent wave velocity of the ultrasonic wave, and, according to a TDOA positioning method, an expression of the nonlinear positioning equation set is:

$$\begin{cases} (x-0)^2 + (y-0)^2 + (z-0)^2 = v^2(t_0-t)^2 \\ (x-x_1)^2 + (y-y_1)^2 + (z-z_1)^2 = v^2(t_1-t)^2 \\ (x-x_2)^2 + (y-y_2)^2 + (z-z_2)^2 = v^2(t_2-t)^2 \\ (x-x_3)^2 + (y-y_3)^2 + (z-z_3)^2 = v^2(t_3-t)^2 \\ (x-x_4)^2 + (y-y_4)^2 + (z-z_4)^2 = v^2(t_4-t)^2 \\ (x-x_5)^2 + (y-y_5)^2 + (z-z_5)^2 = v^2(t_5-t)^2 \end{cases} \quad (1)$$

where $x_i$(i=1, 2, ..., 5) is an x-axis coordinate of each of the other 5 ultrasonic sensors, y(i=1, 2, ..., 5) is a y-axis coordinate of each of the other 5 ultrasonic sensors, and $z_i$(i=1, 2, ..., 5) is a z-axis coordinate of each of the other 5 ultrasonic sensors. The nonlinear positioning equation set (1) may be solved to obtain the coordinate of the PD source.

(3) Second-order terms are eliminated to transform the nonlinear positioning equation set into a linear equation set.

Elimination of the second-order terms refers to expanding each equation in the nonlinear positioning equation set for difference calculation to obtain the linear equation set:

the following set of equations is obtained by the equation set (1):

$$(x-0)^2+(y-0)^2+(z-0)^2=v^2(t_0-t)^2 \quad (2),$$

$$(x-x_1)^2+(y-y_1)^2+(z-z_1)^2=v^2(t_1-t)^2 \quad (3),$$

$$(x-x_2)^2+(y-y_2)^2+(z-z_2)^2=v^2(t_2-t)^2 \quad (4),$$

$$(x-x_3)^2+(y-y_3)^2+(z-z_3)^2=v^2(t_3-t)^2 \quad (5),$$

$$(x-x_4)^2+(y-y_4)^2+(z-z_4)^2=v^2(t_4-t)^2 \quad (6) \text{ and}$$

$$(x-x_5)^2+(y-y_5)^2+(z-z_5)^2=v^2(t_5-t)^2 \quad (7).$$

The equations (2)~(7) are spherical surface equations, centers of spherical surfaces are the coordinates of the sensors, any two spherical surfaces in the spherical surfaces (2)~(7) are intersected on a round surface, and the coordinate of the PD source is on these round surfaces.

A circular equation corresponding to intersection of the spherical surfaces (2) and (3) may be obtained by the difference between the equations (2) and (3), and the equation is:

$$2xx_1+2yy_1+2zz_1+v^2(t_1^2-t_0^2)+2v^2t(t_0-t_1)=K_1 \quad (8),$$

where $K_1=x_1^2+y_1^2+z_1^2$.

Similarly, circular equations corresponding to intersection of the spherical surfaces (2) and (4), the spherical surfaces (2) and (5), the spherical surfaces (2) and (6) and the spherical surfaces (2) and (7) may be obtained by solving the equations (2) and (4), the equations (2) and (5), the equations (2) and (6) and the equations (2) and (7) respectively, and the intersected circular equations are respectively as follows:

$$2xx_2+2yy_2+2zz_2+v^2(t_2^2-t_0^2)+2v^2t(t_0-t_2)=K_2 \quad (9),$$

$$2xx_3+2yy_3+2zz_3+v^2(t_3^2-t_0^2)+2v^2t(t_0-t_3)=K_3 \quad (10),$$

$$2xx_4+2yy_4+2zz_4+v^2(t_4^2-t_0^2)+2v^2t(t_0-t_4)=K_4 \quad (11) \text{ and}$$

$$2xx_5+2yy_5+2zz_5+v^2(t_5^2-t_0^2)+2v^2t(t_0-t_5)=K_5 \quad (12),$$

where $K_2=x_2^2+y_2^2+z_2^2,$ $K_3=x_3^2+y_3^2+z_3^2,$ $K_4=x_4^2+y_4^2+z_4^2$ $K_5=x_5^2+y_5^2+z_5^2,$ and $K_i$ represents for a set of constants related to the coordinates of the sensors.

It is set that $G=v^2$, $H=v^2t$, and the equations (8)~(12) may be represented as follows:

$$2xx_1+2yy_1+2zz_1+G(t_1^2-t_0^2)+2H(t_0-t_1)=K_1 \quad (13),$$

$$2xx_2+2yy_2+2zz_2+G(t_2^2-t_0^2)+2H(t_0-t_2)=K_2 \quad (14),$$

$$2xx_3+2yy_3+2zz_3+G(t_3^2-t_0^2)+2H(t_0-t_3)=K_3 \quad (15),$$

$$2xx_4+2yy_4+2zz_4+G(t_4^2-t_0^2)+2H(t_0-t_4)=K_4 \quad (16) \text{ and}$$

$$2xx_5+2yy_5+2zz_5+G(t_5^2-t_0^2)+2H(t_0-t_5)=K_5 \quad (17).$$

The equations (13)~(17) may be combined and expressed in a form of a linear equation set AX=B, where $$A = \begin{bmatrix} 2x_1 & 2y_1 & 2z_1 & t_1^2 - t_0^2 & 2(t_0 - t_1) \\ 2x_2 & 2y_2 & 2z_2 & t_2^2 - t_0^2 & 2(t_0 - t_2) \\ 2x_3 & 2y_3 & 2z_3 & t_3^2 - t_0^2 & 2(t_0 - t_3) \\ \vdots & \vdots & \vdots & \vdots & \vdots \\ 2x_{n-1} & 2y_{n-1} & 2z_{n-1} & t_{n-1}^2 - t_0^2 & 2(t_0 - t_{n-1}) \end{bmatrix},$$

$$X = \begin{bmatrix} x \\ y \\ z \\ G \\ H \end{bmatrix}, B = \begin{bmatrix} K_1 \\ K_2 \\ K_3 \\ \vdots \\ K_{n-1} \end{bmatrix},$$

where $G=v^2$, $H=v^2 t$ and $K_i=x_i^2+y_i^2+z_i^2$ (i=1, 2, ..., n-1)  (18).

(4) Arrival time of an ultrasonic wave from the PD source at each ultrasonic sensor is acquired, and the arrival time of the ultrasonic wave from the PD source at each ultrasonic sensor and a coordinate of each sensor are substituted into the linear equation set (18) for solving and obtaining multiple sample initial values of a coordinate P(x, y, z) of the PD source.

The multiple sample initial values refer to that when more than 6 ultrasonic sensors are used for PD positioning, and coordinates and arrival time $t_i$ corresponding to every ultrasonic sensor are substituted into the linear equation set AX=B to obtain a sample initial value of the coordinate of the PD source, thus to obtain the multiple sample initial values of the coordinate of the PD source.

(5) The multiple sample initial values are screened to remove unreasonable data and obtain effective multiple sample initial values. The unreasonable data refers to that, when the linear equation set is solved in Step (3), part of wave velocities may be imaginary numbers or obviously higher than (or lower than) a numerical value of a normal wave velocity, this is caused by an arrival time error during wave velocity reverse calculation, and the data is unreasonable.

(6) Clustering processing is performed on the effective multiple sample initial values by adopting an improved K-means algorithm.

A K-means algorithm is a pattern classification method which is widely applied. If there are k classes, k samples are selected as initial cluster centers, distances between all the samples and each initial cluster center are calculated, each sample is divided into the closest cluster, then cluster centers and evaluation indexes are calculated, sample classification is performed, these operations are cyclically executed until the evaluation indexes are convergent to make a distance between each sample and the corresponding cluster center minimum, and each cluster center is a mean of all the corresponding samples.

According to the improved K-means clustering algorithm, an evaluation index Q of each sample point is constructed as follows:

$$Q=\omega_i \cdot \|P_i - \overline{P}\|  \quad (19),$$

where $P_i$ is the ith sample point, $\overline{P}$ is a mean of all the sample points, $\|\cdot\|$ represents for a Euclidean distance, and $\omega_i$ is a weight of the ith sample point, and is all 1 herein.

From the formula (19), it can be seen that the evaluation index Q is positively correlated with the Euclidean distance of the mean of the sample points, Q values of the sample points are sequenced from low to high, the samples are equally divided into k classes, and the central sample of each class is selected as an initial cluster center point of the class.

(7) A class with most cluster elements is selected, and a mean of the elements of the class is calculated. Calculation of the mean refers to, after clustering processing in Step (6), selecting all the initial values in the class with most cluster elements and calculating means of the x-axis coordinates, y-axis coordinates and z-axis coordinates of all the initial values respectively to finally obtain an optimal coordinate of the PD source.

Application embodiment: the method of the present invention is suitable for utilizing ultrasonic sensors for PD positioning in a power transformer. For verifying effectiveness and accuracy of the present invention, tests are made under the condition of adding different random noises respectively.

In the embodiment, accurate arrival time refers to theoretically accurate arrival time of an ultrasonic wave from a PD source at an ultrasonic sensor under the condition of no noise. Simulated time after addition of a random noise refers to manual addition of the random noise within a range of [−1×e, 1×e]ms (where e=(0.1%, 1%, 3%)) to the accurate arrival time on the basis of the accurate arrival time.

For facilitating description, design descriptions will be made below for a condition when e=1% in the following Table 1.

TABLE 1

Simulated Experimental Parameter Setting

| Ultrasonic sensor | Ultrasonic sensor coordinate (cm) | Accurate arrival time (ms) | Simulated time after addition of random noise (ms) | | |
|---|---|---|---|---|---|
| | | | e = 0.1% | e = 1% | e = 3% |
| 0 | (0, 0, 0) | 2.6944 | 2.6943 | 2.6883 | 2.6970 |
| 1 | (310, 0, 50) | 2.5804 | 2.5810 | 2.5793 | 2.6069 |
| 2 | (310, 240, 100) | 2.2526 | 2.2525 | 2.2437 | 2.2509 |
| 3 | (0, 240, 150) | 2.1681 | 2.1683 | 2.1750 | 2.1523 |
| 4 | (155, 120, 200) | 1.4485 | 1.4488 | 1.4439 | 1.4484 |
| 5 | (150, 0, 100) | 2.0355 | 2.0351 | 2.0277 | 2.0447 |
| 6 | (310, 120, 80) | 2.1566 | 2.1564 | 2.1608 | 2.1824 |
| 7 | (155, 240, 0) | 2.1101 | 2.1101 | 2.1142 | 2.1189 |

TABLE 2

Positioning Initial Value when e = 1%

| Sensor combination number | Positioning initial value (cm) | | | Calculated wave velocity (cm/ms) | Error (cm) |
|---|---|---|---|---|---|
| | x | y | z | | |
| 1 | 149.392 | 148.463 | 138.946 | 150.23 | 1.960 |
| 2 | 147.169 | 151.309 | 146.866 | 143.31 | 7.541 |
| 3 | 153.540 | 155.626 | 146.404 | 262.85 | 9.230 |
| 4 | 151.205 | 152.172 | 140.373 | 161.96 | 2.512 |
| 5 | 151.417 | 149.010 | 140.778 | 151.97 | 1.896 |
| 6 | 159.136 | 135.037 | 202.917 | 169.21 | 65.314 |
| 7 | 149.580 | 148.223 | 138.277 | 150.80 | 2.511 |
| 8 | 152.838 | 154.413 | 145.141 | 247.41 | 7.346 |
| 9 | 149.540 | 148.765 | 139.062 | 151.22 | 1.618 |
| 10 | 149.477 | 148.486 | 139.022 | 150.30 | 1.877 |
| 11 | 149.446 | 148.390 | 139.295 | 150.34 | 1.843 |
| 12 | 153.441 | 155.558 | 146.411 | 261.40 | 9.156 |
| 13 | 149.315 | 151.768 | 143.413 | 153.51 | 3.905 |
| 14 | 148.689 | 150.489 | 144.689 | 146.47 | 4.893 |
| 15 | 147.957 | 150.238 | 150.557 | 145.16 | 10.756 |
| 16 | 155.583 | 155.689 | 146.515 | 264.34 | 10.295 |
| 17 | 153.559 | 155.685 | 146.454 | 263.63 | 9.308 |

TABLE 2-continued

Positioning Initial Value when e = 1%

| Sensor combination number | Positioning initial value (cm) | | | Calculated wave velocity (cm/ms) | Error (cm) |
|---|---|---|---|---|---|
| | x | y | z | | |
| 18 | 153.534 | 155.649 | 146.341 | 262.93 | 9.198 |
| 19 | 151.000 | 155.216 | 139.982 | 171.03 | 5.311 |
| 20 | 150.680 | 153.306 | 136.234 | 161.47 | 5.058 |
| 21 | 150.298 | 151.034 | 131.775 | 149.30 | 8.295 |

Figure 2:
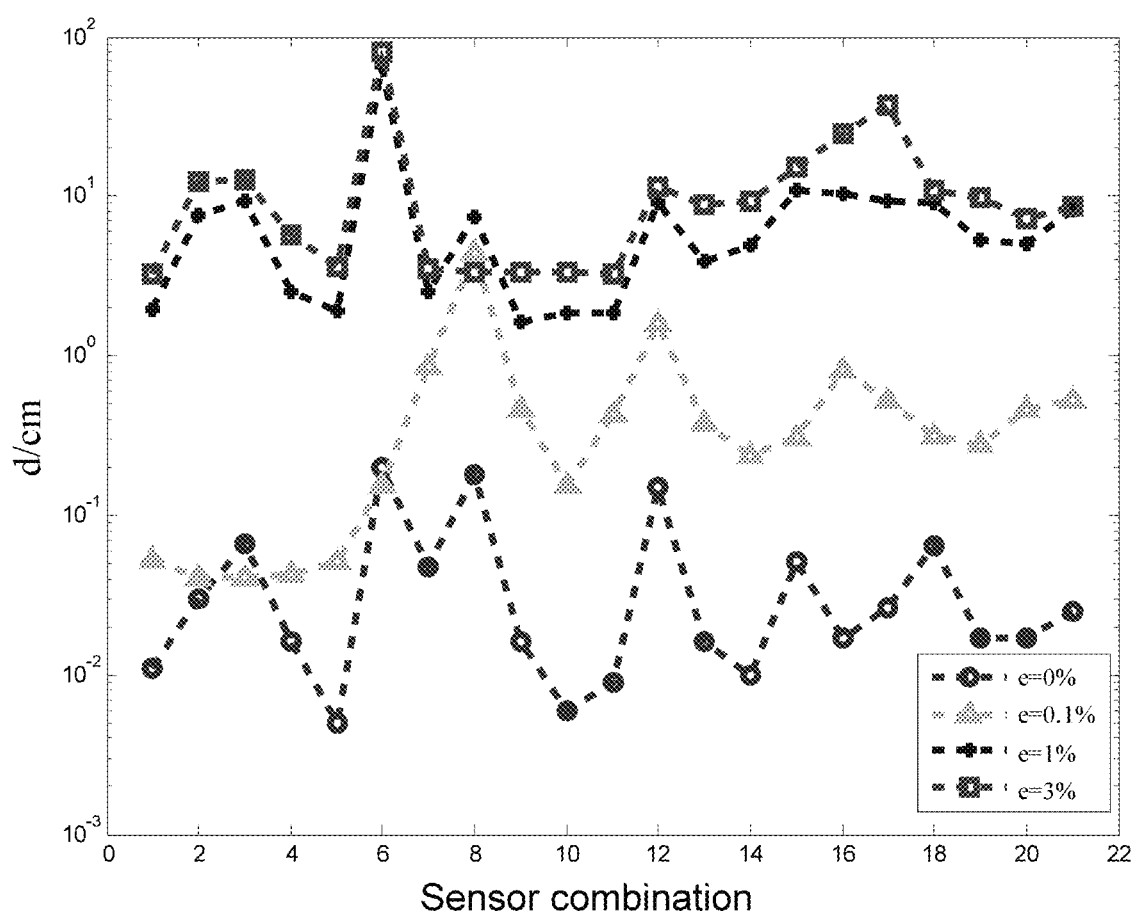
FIG. 2 is a schematic diagram of a positioning initial value error under existence of a noise according to an embodiment of the present invention.

When e=1%, as shown in FIG. 2 and Table 2, some individual points in positioning initial values have relatively great errors with actual discharge points, but most of the positioning initial values are close to the actual discharge points, a theoretical value of an equivalent wave velocity of an ultrasonic wave is 150 cm/ms, calculated equivalent velocities of the ultrasonic wave should be within a range of [130,170]cm/ms, and an equivalent velocity exceeding the range is considered as unreasonable data. In the equivalent wave velocities of the ultrasonic wave calculated by solving AX=B, data (the 3rd, 8th, 12th, 16th, 17th and 18th sets) corresponding to obviously unreasonable wave velocities is removed, there are totally 15 groups of effective sample initial values, and the 15 groups of sample initial values have a mean of (150.29,149.46,144.81) cm and an error of 4.85 cm.

Figure 3:
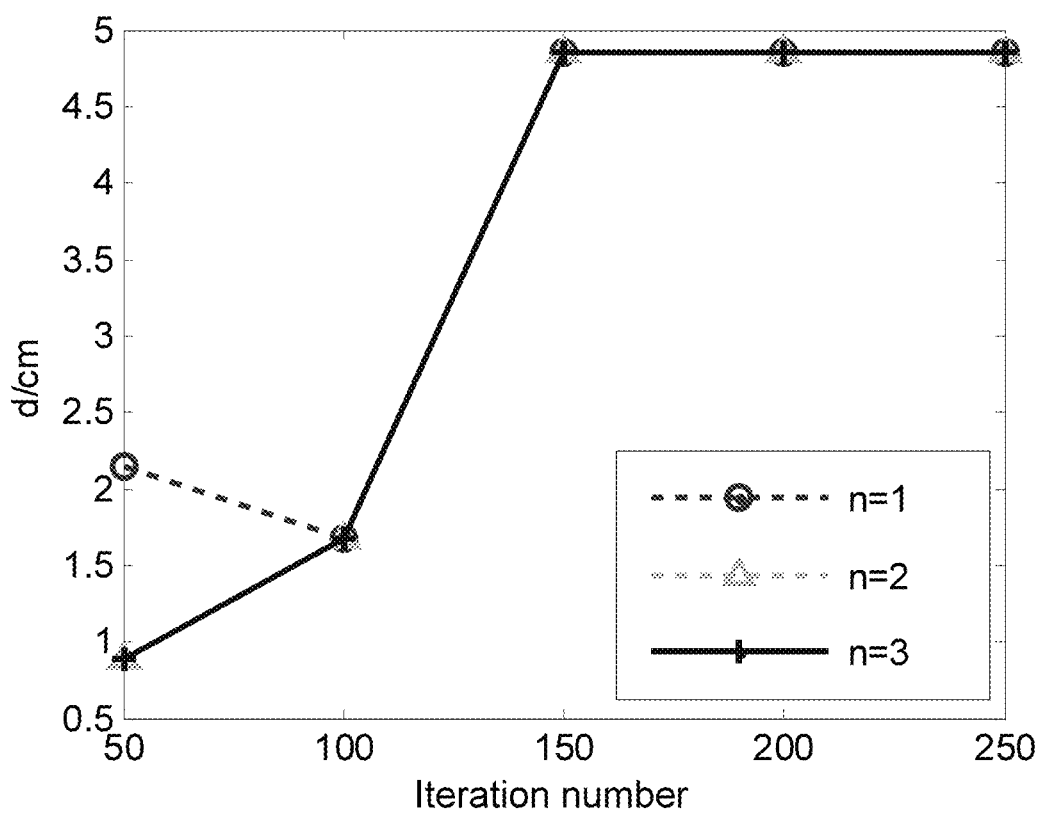
FIG. 3 is a curve diagram of a positioning error and an iteration number when e=1% according to an embodiment of the present invention.
Figure 4:
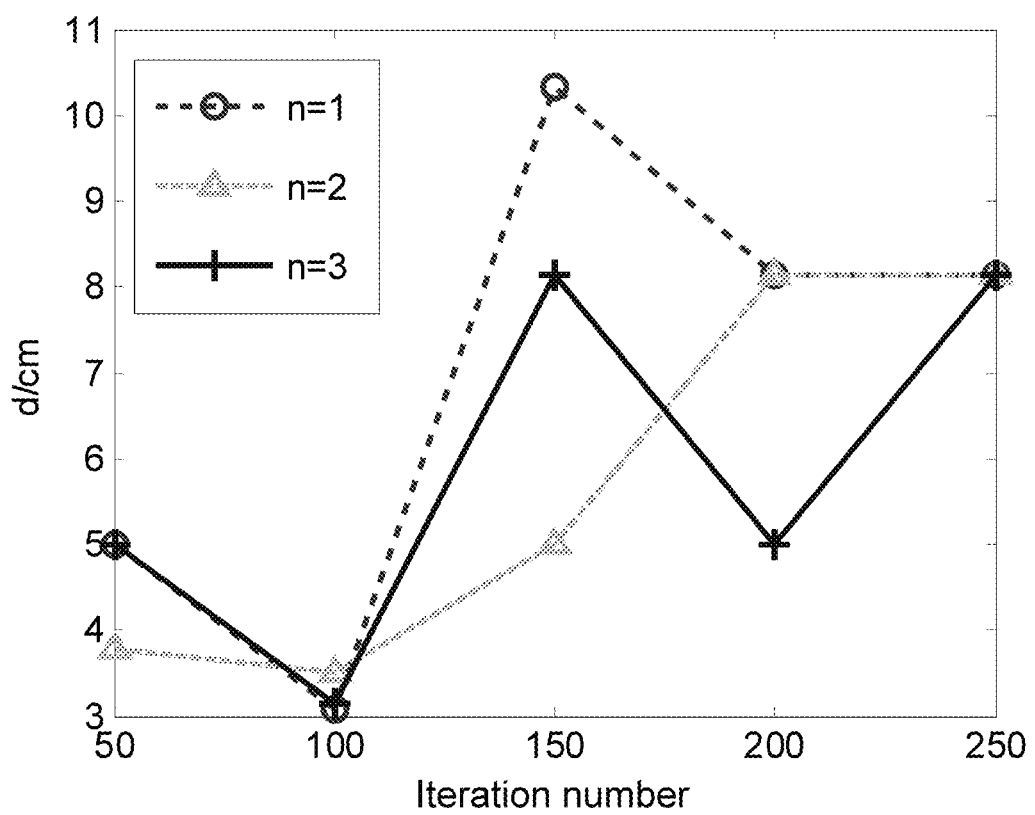
FIG. 4 is a curve diagram of a positioning error and an iteration number when e=3% according to an embodiment of the present invention.

The 15 groups of sample initial values are clustered, there is k=5 classes, and a mean of multiple solutions of the same class is calculated. As shown in FIG. 3 (an abscissa axis represents for an iteration number and an ordinate axis represents for a positioning error), clustering is performed for 3 times respectively (n is the number of clustering times), the error when the iteration number is 50 during clustering of the third time is minimum, and the error when the iteration number is 100 during clustering of the first time and the second time is minimum. Therefore, when e=1%, and when the iteration number is 100, a positioning result after clustering is (150.20, 150.31, 138.37) cm, the positioning error is 1.67 cm, and the positioning accuracy is improved to a certain extent. As shown in FIG. 4 (an abscissa axis represents for the iteration number and an ordinate axis represents for the positioning error), when e=3%, and when the iteration number is 100, the error is minimum, and the positioning error after clustering is about 3.2 cm.

The above simulation result and analysis show that the nonlinear model transformation solving and optimization method for partial discharge positioning based on multi-ultrasonic sensor is feasible.

Those of ordinary skill in the art may make various modifications and transformations to the present invention. If these modifications and transformations fall within the scope of the claims of the present invention and their equivalents, these modifications and transformations also fall within the scope of protection of the present invention. Contents which are not described in the description in detail are the prior art well known to those of ordinary skill in the art.

What is claimed is:

1. A nonlinear model transformation solving and optimization method for partial discharge (PD) positioning based on multi-ultrasonic sensor, comprising following steps:
   (1) in a spatial rectangular coordinate system constructed in a transformer, setting, by a processor, a coordinate of each ultrasonic sensor;
   (2) constructing, by the processor, a positioning model based on an arrival time positioning method to obtain a nonlinear positioning equation set for solving a position of a PD source;
   (3) eliminating, by the processor, second-order terms in the nonlinear positioning equation set to transform the nonlinear positioning equation set into a linear equation set;
   (4) detecting a signal of the PD source and measuring an arrival time of an ultrasonic wave from the PD source at each ultrasonic sensor by each ultrasonic sensor; and
   (4-1) substituting, by the processor, the arrival time of the ultrasonic wave from the PD source at each ultrasonic sensor and the coordinate of each ultrasonic sensor into the linear equation set for solving and obtaining, by the processor, multiple sample initial values of a coordinate of the PD source;
   (5) screening, by the processor, the multiple sample initial values by removing unreasonable data and obtaining effective multiple sample initial values;
   (6) classing, by the processor, the effective multiple sample initial values to a plurality of classes by adopting an improved K-means algorithm; and
   (7) selecting, by the processor, a class with most cluster elements from the plurality of classes, and calculating a mean of the elements of the class, then taking the mean of the elements as an optimal coordinate of the PD source.

2. The nonlinear model transformation solving and optimization method for partial discharge positioning based on multi-ultrasonic sensor according to claim 1, wherein in Step (1), constructing the spatial rectangular coordinate system refers to taking a vertex at the bottom of the transformer as an origin of the spatial rectangular coordinate system and take three edges connected with the vertex as an x-axis, a y-axis and a z-axis of the spatial rectangular coordinate system; and
   setting the position of each ultrasonic sensor refers to placing multiple ultrasonic sensors in the transformer under the constructed spatial rectangular coordinate system, wherein one of the ultrasonic sensor is positioned at the origin and the rest of the ultrasonic sensors are not on the same plane.

3. The nonlinear model transformation solving and optimization method for partial discharge positioning based on multi-ultrasonic sensor according to claim 1, wherein in Step (2), the arrival time positioning method refers to constructing the nonlinear positioning equation set for solving the position of the PD source through information of signal receiving time of the multiple sensors; and
   an expression of the nonlinear positioning equation set is:

$$\begin{cases} (x-0)^2 + (y-0)^2 + (z-0)^2 = v^2(t_0-t)^2 \\ (x-x_1)^2 + (y-y_1)^2 + (z-z_1)^2 = v^2(t_1-t)^2 \\ (x-x_2)^2 + (y-y_2)^2 + (z-z_2)^2 = v^2(t_2-t)^2 \\ (x-x_3)^2 + (y-y_3)^2 + (z-z_3)^2 = v^2(t_3-t)^2 \\ \vdots \\ (x-x_{n-1})^2 + (y-y_{n-1})^2 + (z-z_{n-1})^2 = v^2(t_{n-1}-t)^2 \end{cases},$$

where n is the number of the ultrasonic sensors, the position $(x_0, y_0, z_0)$ of the reference sensor is at the origin, namely, $x_0=y_0=z_0=0$, $x_i$ (i=1, 2, . . . , n−1) is an x-axis coordinate of each of the other n−1 ultrasonic sensors, $y_i$(i=1, 2, ..., n−1) is a y-axis coordinate of each of the other n−1 ultrasonic sensors, $z_i$(i=1, 2, ..., n−1) is a z-axis coordinate of each of the other n−1 ultrasonic sensors, t is occurrence time of PD, $t_i$(i=1, 2, ..., n−1) is the arrival time of the ultrasonic wave from the PD source at each ultrasonic sensor, and v is an equivalent wave velocity of the ultrasonic wave.

4. The nonlinear model transformation solving and optimization method for partial discharge positioning based on multi-ultrasonic sensor according to claim 3, wherein in Step (3), eliminating the second-order terms refers to expanding each equation in the nonlinear positioning equation set for difference calculation to obtain a linear equation set AX=B, where $$A = \begin{bmatrix} 2x_1 & 2y_1 & 2z_1 & t_1^2 - t_0^2 & 2(t_0 - t_1) \\ 2x_2 & 2y_2 & 2z_2 & t_2^2 - t_0^2 & 2(t_0 - t_2) \\ 2x_3 & 2y_3 & 2z_3 & t_3^2 - t_0^2 & 2(t_0 - t_3) \\ \vdots & \vdots & \vdots & \vdots & \vdots \\ 2x_{n-1} & 2y_{n-1} & 2z_{n-1} & t_{n-1}^2 - t_0^2 & 2(t_0 - t_{n-1}) \end{bmatrix},$$

$$X = \begin{bmatrix} x \\ y \\ z \\ G \\ H \end{bmatrix}, B = \begin{bmatrix} K_1 \\ K_2 \\ K_3 \\ \vdots \\ K_{n-1} \end{bmatrix},$$

$G=v^2$, $H=v^2 t$ and $K_i = x_i^2 + y_i^2 + z_i^2$ (i=1, 2, ..., n−1).

5. The nonlinear model transformation solving and optimization method for partial discharge positioning based on multi-ultrasonic sensor according to claim 4, wherein in Step (5), the unreasonable data refers to part of equivalent wave velocities of the ultrasonic wave calculated when the linear equation set is solved in Step (3) are imaginary numbers or obviously higher than or lower than a numerical value of a normal wave velocity.

6. The nonlinear model transformation solving and optimization method for partial discharge positioning based on multi-ultrasonic sensor according to claim 4, wherein in Step (6), the improved K-means algorithm specifically comprises the following steps:

1) calculating an evaluation index Q of each sample point in N sample points according to the following formula:

$Q = \omega_i \| P_i - \bar{P} \|$, where $P_i$, is the ith sample point, $\bar{P}$ is a mean of the sample points, $\|\cdot\|$ represents for a Euclidean distance, $\omega_i$ is a weight of the ith sample point, $\omega_i$ is all 1 herein, i=1, 2, ..., N, N is the total number of the sample points, and the evaluation index Q is positively correlated with the Euclidean distance of the mean of the sample points; sequencing Q values of the sample points from low to high, equally dividing samples into k classes, k=N/3~N/2, and selecting a central sample of each class as an initial cluster center point of the class;

2) if a distance between two initial cluster center points is smaller than a predetermined threshold value θ, wherein θ<5cm, removing one cluster center point to update a cluster number recorded as k*;

3) calculating Euclidean distances between each sample point $P_i$, and all cluster centers, and if the following formula is met, dividing the sample point $P_i$, into a class $C_l$:

$$\| P_i - c_l \| < \| P_i - c_m \| \qquad (20),$$

where l =1, 2, ..., k; m =1, 2, ... k; i=1, 2, ... N, l±m, $c_l$ is the cluster center of the class $C_l$, and $c_m$, is the cluster center of a class $C_m$;

4) recalculating new cluster centers according to a new cluster relationship; and 5) ending if the improved K-means algorithm meets a convergence condition, otherwise returning to Step 2) for next iterative calculation, wherein the convergence condition is as follows:

①  changes in distances between the cluster center points in two iterations are smaller than a threshold value ε, wherein ε<0.0001, and ②  is kept unchanged in the following formula:

$$E = \sum_{i=1}^{k} \sum_{P_j \in C_i} \| P_j - c_i \|^2,$$

where E is a sum of square errors of all objects in the sample points, $P_j$ is a sample point of a class $C_i$, $c_i$ is the cluster center of the class $C_i$, and $\|\cdot\|^2$ represents for a square Euclidean distance.

7. The nonlinear model transformation solving and optimization method for partial discharge positioning based on multi-ultrasonic sensor according to claim 6, wherein for preventing an endless loop caused by the fact that the ending condition in Step 5) is not met, a fixed maximum iteration number is given during execution of the algorithm, and when an iteration number reaches the maximum iteration number, clustering ends.

8. The nonlinear model transformation solving and optimization method for partial discharge positioning based on multi-ultrasonic sensor according to claim 1, characterized in that, in Step (4-1), the multiple sample initial values refer to that more than 6 ultrasonic sensors are used for PD positioning, and coordinates and arrival time $t_i$ corresponding to each of the 6 ultrasonic sensors are substituted into the linear equation set to obtain a sample initial value of the coordinate of the PD source, thus to obtain the multiple sample initial values of the coordinate of the PD source.

9. The nonlinear model transformation solving and optimization method for partial discharge positioning based on multi-ultrasonic sensor according to claim 1, wherein in Step (7), calculating the mean refers to, after clustering processing in Step (6), selecting all the initial values in the class with most cluster elements, and calculating means of x-axis coordinates, y-axis coordinates and z-axis coordinates of all the initial values respectively to obtain a final coordinate of the PD source.

10. The nonlinear model transformation solving and optimization method for partial discharge positioning based on multi-ultrasonic sensor according to claim 1, wherein the method is performed in a power grid and the calculated optimal coordinate of the PD source is used to fix a corresponding insulation defect for improving operability and prolonging a service life time of the power grid.

* * * * *